United States Patent
Suzuki et al.

(10) Patent No.: US 9,474,177 B2
(45) Date of Patent: Oct. 18, 2016

(54) WIRELESS DISPLAY MOUNT, WIRELESS DISPLAY MOUNT APPARATUS, AND WIRELESS DISPLAY SYSTEM

(71) Applicant: TERAOKA SEIKO CO., LTD., Tokyo (JP)

(72) Inventors: Hidemoto Suzuki, Tokyo (JP); Yuichi Inoue, Tokyo (JP)

(73) Assignee: TERAOKA SEIKO CO., LTD., Tokyo (JP)

( * ) Notice: Subject to any disclaimer, the term of this patent is extended or adjusted under 35 U.S.C. 154(b) by 388 days.

(21) Appl. No.: 13/867,200

(22) Filed: Apr. 22, 2013

(65) Prior Publication Data

US 2013/0286564 A1     Oct. 31, 2013

(30) Foreign Application Priority Data

Apr. 26, 2012   (JP) .................. 2012-101587
Apr. 26, 2012   (JP) .................. 2012-101588

(51) Int. Cl.
| | | |
|---|---|---|
| H02J 7/00 | (2006.01) | |
| H01F 27/42 | (2006.01) | |
| H05K 5/02 | (2006.01) | |
| G09F 3/20 | (2006.01) | |

(52) U.S. Cl.
CPC ............ *H05K 5/0247* (2013.01); *G09F 3/204* (2013.01); *G09F 3/208* (2013.01)

(58) Field of Classification Search
CPC ..................................................... H02J 7/025
USPC ............................................................ 320/108
See application file for complete search history.

(56) References Cited

U.S. PATENT DOCUMENTS

| 5,537,126 A | 7/1996 | Kayser et al. |
| 5,583,487 A | 12/1996 | Ackerman et al. |

(Continued)

FOREIGN PATENT DOCUMENTS

| CN | 2366994 | 3/2000 |
| CN | 2729507 | 9/2005 |

(Continued)

OTHER PUBLICATIONS

Office Action issued in China Counterpart Patent Appl. No. 201310149070.9, dated Nov. 25, 2015, along with an English translation thereof.

(Continued)

*Primary Examiner* — Edward Tso
*Assistant Examiner* — Ahmed Omar
(74) *Attorney, Agent, or Firm* — Greenblum & Bernstein, P.L.C.

(57) ABSTRACT

Provided are a wireless display mount capable of facilitating changes to the arrangement for the mount without, for example, having to rewire the power wire; and a wireless display system capable of highly efficient supply of electricity to a wireless display. A wireless display mount supplies electricity to a wireless display wirelessly via electromagnetic induction and includes a case, a power wire and a connection terminal. The case has a cavity in-between the power wire where a wireless display may be installed. A wireless display system includes a wireless display, and wireless display mount. The wireless display has a loop coil. The wireless display mount has a housing for housing the power wire, disposed adjacent to the loop coil and formed at a location separated from the mounting surface of the wireless display mount.

12 Claims, 3 Drawing Sheets

(56) References Cited

U.S. PATENT DOCUMENTS

| | | | | |
|---|---|---|---|---|
| 6,089,453 | A * | 7/2000 | Kayser | G06K 17/00 235/378 |
| 6,271,807 | B1 | 8/2001 | Kayser et al. | |
| 7,287,001 | B1 * | 10/2007 | Falls | G06Q 10/087 235/383 |
| 8,749,194 | B1 * | 6/2014 | Kelsch et al. | 320/108 |
| 2002/0146282 | A1 | 10/2002 | Wilkes et al. | |
| 2012/0013467 | A1 * | 1/2012 | Byun | H01M 10/4207 340/572.1 |

FOREIGN PATENT DOCUMENTS

| | | |
|---|---|---|
| CN | 1900947 A | 1/2007 |
| CN | 201237070 Y | 5/2009 |
| JP | 08-340602 | 12/1996 |
| JP | 09-510304 | 10/1997 |
| JP | 2002-315660 | 10/2002 |
| JP | 2009-247183 | 10/2009 |
| JP | 2012-014383 | 1/2012 |
| JP | 2012-020655 | 2/2012 |

OTHER PUBLICATIONS

Office Action issued in Japan Counterpart Patent Appl. No. 2012-101587, dated Dec. 22, 2015 , along with an English translation thereof.

Office Action issued by China patent office in China Patent Application No. 2013-10149070.9, dated Jul. 21, 2016, and an English translation thereof.

* cited by examiner

WIRELESS DISPLAY MOUNT, WIRELESS DISPLAY MOUNT APPARATUS, AND WIRELESS DISPLAY SYSTEM

FIELD OF THE INVENTION

The present invention relates to a wireless display mount equipped with a mechanism for the wireless supply of electricity to a wireless display attached thereto, and a wireless display mount apparatus that employs said wireless display mount, as well as a wireless display system having a wireless display, and a wireless display mount which secures the display and supplies electricity to said wireless display wirelessly via electromagnetic induction.

BACKGROUND OF THE INVENTION

Warehouses, for example, distribution centers, often sort various kinds of goods received by delivery destination. These goods are displayed on shelves where wireless displays capable of wireless communication are attached to the shelf for each article.

For instance, when picking instruction data are transmitted from a control device to a corresponding wireless display, it is possible for the display unit of the wireless display to present the quantity of articles to be picked. An operator may then perform picking in accordance with the quantity displayed on the display unit.

Incidentally, it is normal for the aforementioned wireless display to be equipped with a rechargeable battery. Thus, after operating for a certain amount of time, the wireless display must be detached from the shelf, charged, reattached to the shelf after being charged, and then put to use. Consequently, while the mounting location may be freely modified even if the layout of the shelves change, there is the problem that management of charging the displays needs to be done manually.

Therefore, an attempt has been made recently to attach the wireless display to a rail mount, and supply electricity to the wireless display wirelessly, as exemplified in Patent Document 1. According to this method, supplying electricity wirelessly to the wireless display allows the wireless display to be arranged at any location as with the above mentioned rechargeable type display.

Patent Document 1: Japanese laid-open patent publication No. H09-510304

DISCLOSURE OF THE INVENTION

Problems to be Solved by the Invention

However, usually, the aforementioned wireless display is arranged on multi-level shelves in, for example, a warehouse, therefore each level in the shelf needs multiple rail mounts for that purpose. The power wire that supplies electricity wirelessly to the wireless display attached to the mount requires wiring a lengthy and continuous wire laid out to span each level of the mounts.

Therefore, if the location and number of levels of shelving changes because of a change in the store layout, the wiring of the power wire must be redone to correspond with the change in layout, and thus there is a problem that for instance, reducing the number of mounts, or changing the installation location and so forth cannot be performed quickly.

Moreover, the mount is usually attached to a metallic shelf, and consequently iron loss occurs then the power wire wired to and installed in said mount comes near a metallic shelf. Consequently, there are cases where power supply is less efficient due to the loss caused by the iron loss.

The present invention addresses the problems found in conventional technology and provides a wireless display mount capable of facilitating changes to the arrangement layout for the wireless display mount without, for example, having to rewire the power wire; and a wireless display system capable of efficiently supplying electricity to the wireless display.

Means for Solving the Problem

The present invention addresses the above problems by providing, for example a wireless display mount which supplies electricity to a wireless display wirelessly via electromagnetic induction. The wireless display mount includes a band-shaped case; a power wire having a prescribed length, that is wired to and arranged in the case along the longitudinal direction of the case and so that the power wire is spaced apart in the width direction of said case; a connection terminal connecting both ends of the power wire with another power wire; and further, the case has a space in-between the spaced-apart power wire into which a wireless display may be installed.

For example, the other power wire connected via a connection terminal to the power wire that is wired to and housed in the case may be the power wire for another wireless display mount having the same structure, or the power wire for interconnecting the power wire of said other wireless display mount to configure a coil with at least one turn; together with a connection terminal this interconnecting power wire configures a looped terminating member. Alternatively, the other power wire connected via a connection terminal to the power wire that is wired to and housed in the case together with a connection terminal may configure a starting member that outputs an alternating current.

The space in the case into which the wireless display can be installed may be of any appropriate form. For instance, the space may be a substantially U-shaped rail in its cross-section, and the wireless display may be slid from the longitudinal direction of the mount to be installed, or pressed in from the front and installed, and so forth.

Herewith, the mount to which the wireless display is installed is integrated with a power wire that supplies electricity to a wireless display wirelessly via electromagnetic induction. The end section of that power wire is provided with a connection terminal allowing electrical connection to, for example, said mount, a terminating member, and a starting member; therefore, the number of mounts and connections thereto may be increased or decreased in accordance with the arrangement layout for the wireless display, and to correspond with the arrangement layout.

One power wire may be wired to and housed in the case along the longitudinal direction of the case at intervals in the width direction of the case. Additionally, the one power wire may be used to configure a coil with at least one turn by connecting together each power wire from one to multiple wireless display mounts, from terminating members, and from starting members. However, multiple turns, for example two turns, may be provided to double the electromotive force produced by electromagnetic induction. In that case, the electromotive force is proportional to the number of turns in the coil. When configuring the number of turns in the coil as multiple turns, connection terminals may be attached to the end sections of the power wire so that the coil with multiple turns is a series of single wires (drawn as a continuous line).

Further, various materials exist for making the shelf to which the wireless display will be mounted such as a metal magnetic body, or a non-magnetic plastic, and so forth. If the shelf is metallic, the power wire wired into the wireless display mount may suffer from iron loss when it comes close to the shelf. Hence, to reduce the loss due to iron loss, the housing location for the power wire in the case for the wireless display mount is disposed away from the mounting surface of said mount by a prescribed distance.

Additionally, multiple power wires may be arranged in the mount with respect to the case, along and overlapping a direction (vertical direction) that intersects at right angles to the mounting surface of the mount. In that case, the space in which the wireless display may be installed is defined in-between the power wire, and installing the wireless display in said space thereby reduces the amount the wireless display will protrude from the front surface of the mount.

Further, to address the above described problems a wireless display system according to the present invention includes a wireless display and a wireless display mount provided with a securing means for securing the wireless display and a power supply means for supplying electricity to the wireless display wirelessly via electromagnetic induction, wherein; the wireless display having a loop coil inside; the wireless display mount has a cavity which houses and secure a housing section which houses the power wire of the power supply means inside the band-shaped case and the wireless display between the power wires; and the housing section is disposed at a position that is near the loop coil of the wireless display when said wireless display is installed in the cavity of said wireless display mount, and is formed at a position that is away from the mounting surface of the wireless display mount.

The aforementioned wireless display is provided with an electrical display unit (for example a segment display unit, or an LCD display unit). The wireless display is configured to receive and display the data sent from the above described control device.

Herewith, when the wireless display is installed in the cavity in the wireless display mount, the loop coil in said wireless display is disposed at a location near the power wire that is housed in the housing section inside the case for the wireless display mount, thus, allowing highly efficient supply of electricity to the wireless display. The housing section which houses the power wire is disposed away from the mounting surface, therefore even if hypothetically the mounting surface to which the wireless display mount will be mounted is a metal shelf, the amount of iron loss may be reduced, thus allowing highly efficient supply of electricity to the wireless display.

The housing section may be positioned, for example, on both sides in the width direction near the end sections in contact with the mounting surface on the case separated therefrom by a prescribed distance (for example, about 5 mm).

Herewith, the loop coil in the wireless display and the power wire in the wireless display mount may be disposed near each other, and the power wire may be separated from the mounting surface of the wireless display mount. Consequently, reducing the iron loss and improving the efficient supply of electricity to the wireless display.

The loop coil in the wireless display may be disposed opposite the inside of a power wire that is housed in the housing section. However, it is preferable that substantially the center of the coil wire that makes up the loop coil is positioned facing substantially the center of the height of said power wire.

Furthermore, the wireless display may be provided with an electromagnetic wave absorber on the inside. Specifically, an electromagnetic wave absorber (sheet) may be arranged inside the display between the loop coil and a printed circuit board to reduce the effects of the printed circuit board and to reduce the leakage of magnetic flux.

Effects of the Invention

A wireless display mount according to the present invention is provided integrally with a power wire that supplies electricity to the wireless display wirelessly via electromagnetic induction. The end section of the power wire is provided with a connection terminal allowing electrical connection to, for example, said mount, a terminating member, and a starting member; therefore, the number of mounts and connections thereto may be increased or decreased in accordance with the arrangement layout for the wireless display, and thus facilitates providing a wireless power supply line via electromagnetic induction. Accordingly, even when the number of shelves used by the store decreases, merely removing the wireless display mount mounted to a shelf that is no longer needed, and mutually connecting the remaining mounts completes the work of rewiring the power wire. Therewith replacement wiring of the power wire with respect to a change in shelving layout may be easily carried out.

Additionally, in the wireless display system according to the present invention, the power wire for the wireless display mount and the loop coil for the wireless display device installed in said mount are arranged near each other. The relevant power wire is disposed at a prescribed distance away from the mounting surface for said wireless display mount. Thereby is provided a wireless display system capable of keeping the iron loss low, and efficiently supplying electricity.

DETAILED DESCRIPTION

Generally when various goods brought into a distribution center are sorted by the respective delivery destinations, wireless display units capable of wireless communication are provided per good on the shelf on which the goods are displayed. The wireless display receives picking instruction data, which specifies the quantity of goods to be retrieved, from a control device and displays said picking instruction data on the display unit.

The wireless display, not provided with its own power source (battery), operates on the supply of electricity it receives wirelessly by way of electromagnetic induction.

Therefore, the wireless display mount to which said wireless display may be mounted has a combined support function for securing the wireless display, and electric power supply function for supplying electricity to the wireless display wirelessly by way of electromagnetic induction.

One example of an embodiment of a wireless display mount and a wireless display system according to the present invention will be described below on the basis of the drawings.

Figure 1:
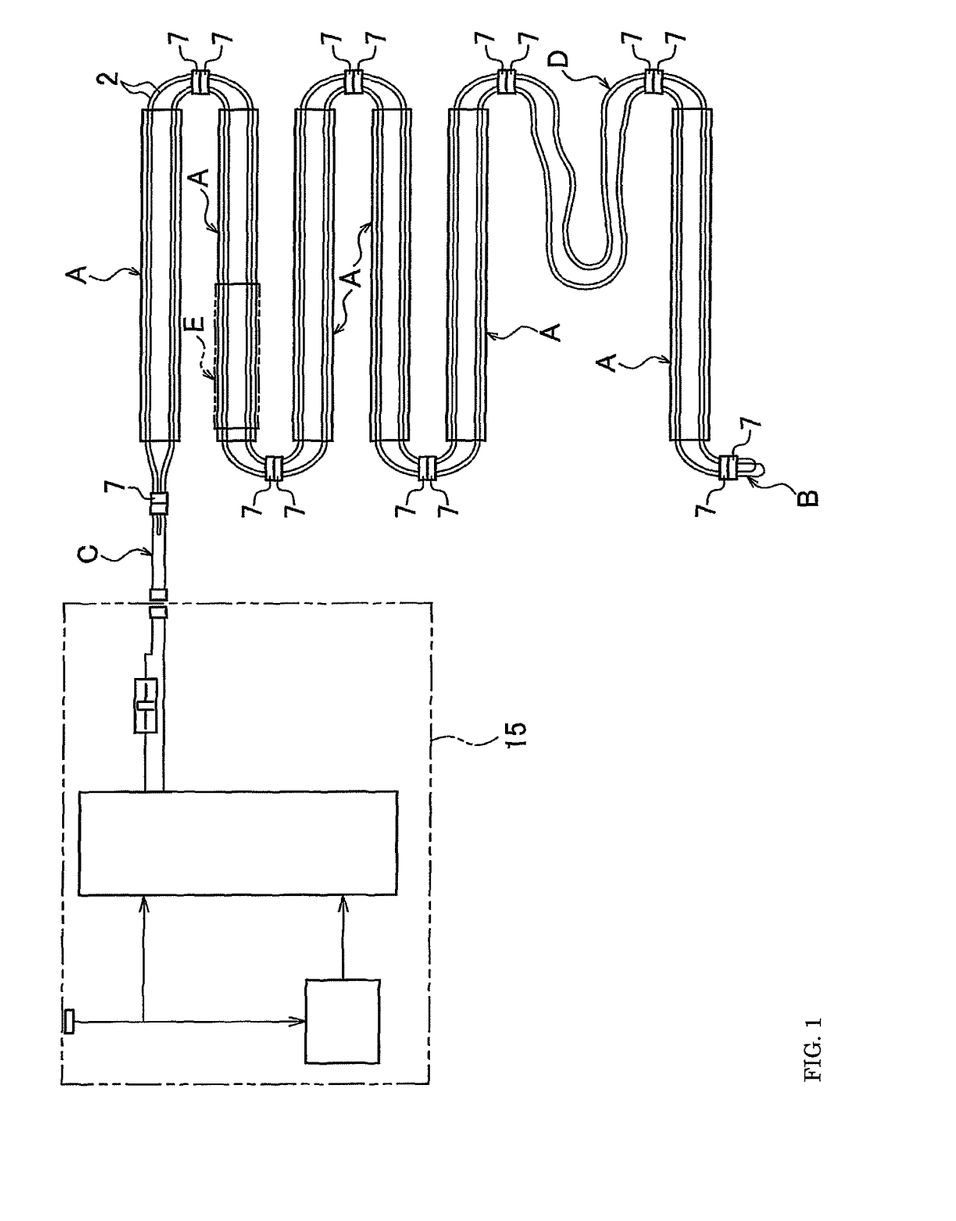
FIG. 1 is a schematic diagram showing one example of a wireless display mount and a wireless display system according to the present invention.

FIG. 1 shows an outline of wireless display mount apparatus to which a wireless display mount A is connected, and a wireless display system. Multiple (in the drawing, six) wireless display mounts A are connected in series and arranged via a connecting member D which makes a connection between said fellow wireless display mounts A, and connects said wireless display mounts A with one another. Further, a terminating member B connected to a wireless display mount A on one end in the connected series, and a starting member C connected to a wireless display mount A on another end in the connected series are respectively connected to configure a power supply line that supplies electricity to a wireless display E wirelessly by electromagnetic induction.

The wireless display mount A may be configured from a rail type case 1 which is molded from plastic, and power wires 2, 2' (power supply means) which are wired into and housed along the longitudinal direction of the case 1, and with a gap therebetween in the width direction of the case 1.

Figure 2:
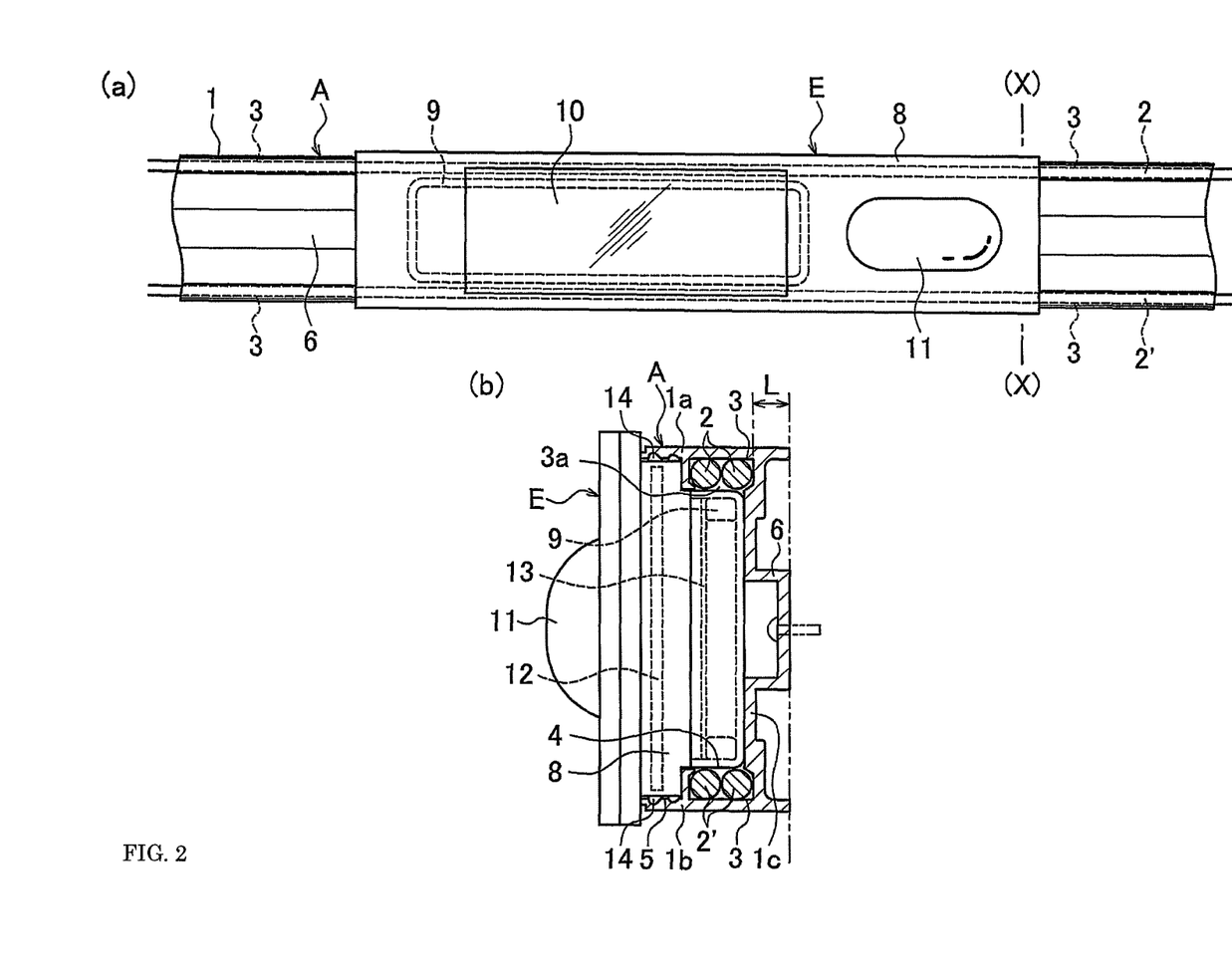
FIG. 2A is a front view of the wireless display mount with a wireless display mounted thereto.
FIG. 2B is a partial cut out exploded view along the line X-X in FIG. 2A.

As shown in FIG. 2B, the case 1 is formed from plastic material as a substantially U-shaped rail in the cross-section thereof. A housing section 3 is formed from a rear wall 1c that links sidewalls 1a, 1b along and parallel to the sidewalls 1a, 1b. The power wires 2, 2' are wired and housed on the inside of both sidewalls 1a, 1b (top and bottom in the figure) in the width direction (the direction orthogonal to the longitudinal direction). An opening 3a for inserting and housing the power wire 2 (or 2') is formed in the surface of the housing section 3 that faces the sidewalls 1a, 1b.

The housing section 3 is formed so that multiple power wires (two, in the drawing) may be housed disposed along the sidewalls 1a, 1b, and parallel to each other. The housing sections 3 and rear wall 1c together define a cavity 4 (space) into which the wireless display E is installed.

Additionally, a locking part 5 (securing means) is formed on the inner surface near the tip end of the sidewalls 1a, 1b. The locking part latches to and secures a wireless display E installed in the cavity 4.

The locking part 5 is provided with a groove which spans the entire length of the case 1 on the inside surface of the sidewalls 1a, 1b; a ridge formed on the outer surface of the housing for the wireless display E is inserted into said groove. Thereby, the wireless display E may be slid and inserted from the side end of the case 1 in the longitudinal direction, or pressed in from the front surface side (between the sidewall 1a and the sidewall 1b) at a suitable location in the longitudinal direction of said case to be latched and secured. Moreover, the shape of the ridge and grove may be the opposite of the shape exemplified in the drawing.

If the wireless display mount A is to be mounted to the front surface of a shelf, the rear wall 1c which forms a boundary of the housing section 3 is formed away from the rear end of the sidewalls 1a, 1b so that the housing section 3 is separated from the front surface (the mounting surface) of the shelf by as much as a prescribed distance L (for example, approximately 5 mm). However, an securing section 6 for anchoring the wireless display mount A to a shelf and the like may be formed in the rear wall 1c expanding from substantially the center in the width direction thereof.

Moreover, in terms of methods for fixing the securing section 6 to the front surface of the shelf, either the method illustrated in the drawing of fixing the securing section 6 with a screw, or for example a method of fixing the securing section 6 with a double-sided adhesive tape may be used.

The power wire 2, 2' wired into and housed in the housing section 3 which is formed along the sidewalls 1a, 1b of the case is a well-known type of electrical cable. That is, the power wire may be a conductive wire material coated with vinyl; the power wire 2, 2' in question is made long enough to protrude from both side ends of the case 1 in the longitudinal direction; and the number of power wires (two, in the illustrated example) housed in the case 1 is the number of wires needed to configure the required number of turns (two turns, in the illustrated example).

The power wire 2, 2' is housed in the housing section 3 so that the electrical wires that make up the power wire 2, 2' are housed parallel to each other along the sidewalls 1a, 1b in the housing section 3 that is formed along the sidewalls 1a, 1b. Additionally the power wire 2, 2' is housed so that the loop coil 9 installed in a wireless display that may be mounted to the wireless display mount A is disposed between the housing sections 3 and corresponding to the electrical wires.

Furthermore, a connection terminal 7 may be installed at both end sections of the power wire 2, 2' which allows the power wire 2, 2' to be connected in series to the power wire 2,2 of the wireless display mount A, or connected to a terminating member B or starting member C which connects the end sections of the wireless display mount, or connected to a connecting member D which connects the power wire 2, 2' of the wireless display mounts A to each other.

The connection terminal 7 is installed on the power wire so that when the terminating member B and starting member C, are connected to the power wire 2, 2 of the wireless display mount, or the connecting member D is connected to each power wire, the power wire that is connected establishes a coil with at least one turn with a continuous line. That is, the mutual connection of the wireless display mounts is coupled by straight hard wiring; connection of the terminating member B provides looped coupling for the power wire 2, 2 in the wireless display mount A; connection of the starting member C provides output of alternating current between power wires 2, 2', and the power wires are coupled in a loop. Furthermore the starting member C is connected to a power supply unit.

Figure 3:
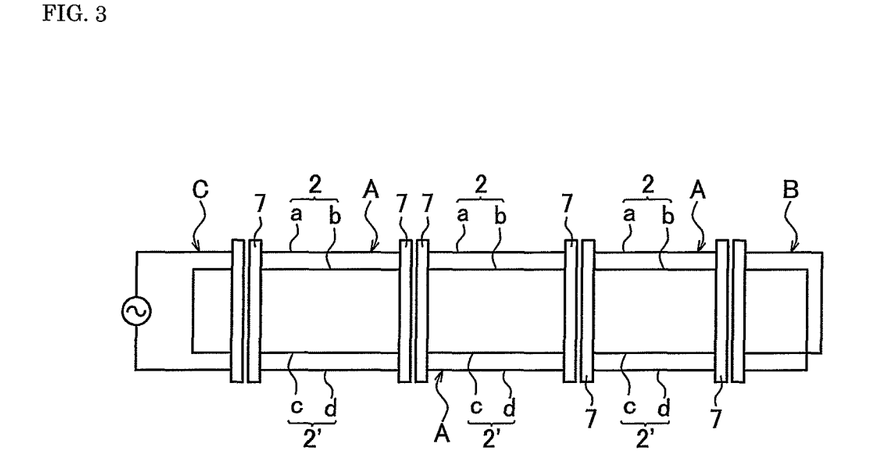
FIG. 3 is an explanatory diagram showing a connection state of a power wire connected to a wireless display mount with a starting member and a terminating member.

FIG. 3 shows a connection state when three wireless display mounts A are connected in series and the power wires are connected two each other with a terminating member B on one end section of a wireless display mount A and a starting member C on the other end. FIG. 3 also shows a mode where two wires (a, b), (c, d) each act as a respective power wire 2, 2' wired into and housed in the case 1 of a wireless display mount A.

The respective power wires 2 (a, b), 2' (c, d) in the mutual wireless display mounts A have a straight connection to each other via the connection terminal 7; and a terminating member B is connected to one end section of a wireless display mount A to connect power wire 2 and power wire 2'. That is, the terminating member B respectively connects (a) in power wire 2 and (c) in power wire 2, and (b) in power wire 2 and (d) in power wire 2' and loops back. Additionally, a starting member C is connected to the other end of a wireless display mount A to connect power wire 2 and power wire 2'. The starting member outputs AC power between (a) in power wire 2 and (d) in power wire 2', connects (b) in power wire 2 and (c) in power wire 2' and loops back. Thereby, the terminating member B and starting member C are connected to the wireless display mount A and the wiring formed is a continuous line, which creates two turns of a coil.

Although one power wire each (one turn) may be wired to and housed in the case 1 of the wireless display mount A, the electromotive force is such that it will be proportional to the number of turns in the coil according to the law of electromagnetic inductance. Accordingly, increasing the number of turns by a multiple of two doubles the electromotive force.

As shown in FIG. 2A, the wireless display is provided with, for example, a loop coil 9 wired to and housed inside the housing (case), a display unit located on the front surface on the case, and a completion button 11. The loop coil 9 receives electricity via electromagnetic induction and is located in-between the power wire 2, 2' of the wireless display mount A when the wireless display is mounted thereto. Thus, the wireless display E mounted to the wireless display mount A is receives electricity from the power wire 2, 2' in the wireless display mount A via electromagnetic induction, and electrically operates the display means by way of the electricity received. The display unit 10 may be, for example, a segment display or a liquid crystal display, and so forth.

Furthermore, a printed circuit board 12 is disposed inside the housing 8 for electrically) connecting the loop coil 9 and the display unit 10, as well as the completion button 11, with an electromagnetic wave absorber sheet 13 disposed inserted between the printed circuit board 12 and the loop coil 9. Inserting the electromagnetic wave absorber sheet 13 thereby reduces the effects of the electromagnetic waves radiating from the printed circuit board on the loop coil.

Additionally, a ridge 14 is formed on the outside surface of the peripheral wall of the housing 8 which faces the sidewalls 1a, 1b of the case 1 of the wireless display mount A. The ridge 14 is formed to be able to fit together with and latch into the groove of the locking part 5 formed on the sidewalls 1a, 1b of the wireless display mount A.

When said wireless display E is mounted to the wireless display mount A by latching together the locking part 5 and the ridge 14, the loop coil 9 built into the housing 8 is located on a substantially center line of the power wire 2, 2' that is housed and wired into the housing 3 of the wireless display mount A (a position substantially at the center of the electrical wires arranged and housed parallel to each other). Herewith, the loop coil 9 (power receiving) section of the wireless display E is set in-between the housing sections 3, and consequently it is possible to reduce the amount by which the wireless display protrudes from the wireless display mount A when said wireless display is mounted to the wireless display mount A.

As an example of how the aforementioned wireless display may be used, for instance, sends picking instruction data; the wireless display E receives picking instruction data from a control device (not shown) and displays said data which specifies the quantity of articles to be picked. Once the picking operation for picking the displayed quantity of goods is complete, the operator presses the completion button 11, and thereby the quantity designated for picking as per the picking instruction data is sent to the control device as the actual quantity picked.

As indicated in the above described embodiment, a power wire is wired to and housed in the wireless display mount A, and the power wire supplies electricity wirelessly via electromagnetic induction to a wireless display installed on said mount. In addition, both ends of the power wire have connection terminals installed thereon. Therefore, connecting the wireless display mounts in accordance with the arrangement layout of the wireless displays thereby facilitates easy installation of a supporting means that provides the wiring for supplying electricity, and secures the wireless display. Accordingly, the number of mounts and connections thereto may be increased or decreased in accordance with the arrangement layout for the wireless display, to thereby facilitate correspondence to the arrangement layout.

Further, if there are multiple power wires wired to and housed in the mount case, multiple turns are also formed in the coil, and consequently according to laws of electromagnetic induction the electromotive force is proportional to the number of turns. Therefore, electricity may be supplied independent of influences from the environment in which the wireless display will be installed (for example, on a metallic shelf).

Moreover, the housing section which houses the aforementioned power wire is arranged to be a prescribed distance away from the mounting surface of the said wireless display mount. Therefore, the mounting surface of said wireless display mount reduces the iron loss even when the mounting surface is installed near a metallic shelf.

Arranging the multiple power wires housed in the housing section in a direction intersecting substantially at right angles to the mounting surface of the case, that is, arranging the multiple power wires on top of each other along the side wall which stands at substantially right angles to and protrudes frontward from the rear wall of the case, without lining up the power wires parallel along the rear wall (rear surface) of the case, thereby forms a space into which the wireless display may be installed that is in between each of the housing sections that house the power wires. Thereby efficiently effecting that electromagnetic induction that occurs between the power wires and the loop coil in the wireless display.

However, there is a limit to increasing the number of turns of the power wire within the limited space in the case. Accordingly, given the number of turns that can be made within the limited space, reducing the iron loss as above described will thereby ensure efficient supply of electricity.

Further, combining the terminating member provided with a connection terminal capable of connection to the power wire of the wireless display mount thereby facilitates wiring to increase or decrease the number of wireless displays in accordance with an arrangement layout for he wireless displays.

A wireless display mount according to the present invention need not be limited to the illustrated embodiment. Appropriate modifications may be made within a scope that does not change the spirit of the invention.

1. The embodiment illustrates an example of housing two turns with two power-supplying power wires each. However, without being limited to this example, for instance, either one turn with one power wire each, or three turns with three power wires each and so forth may be housed. Furthermore, this feature may be appropriately determined depending on the desired amount of electromotive force.
2. The embodiment illustrates an example of using a screw as a securing means to secure the wireless display mount to the mounting surface on a shelf. However, without being limited to this example, for instance, the wireless display mount may be secured by using double-sided adhesive tape, or attached by a retainer element and so forth.

3. The embodiment illustrates an example of arranging the power wires that are wired to and housed in the case for the wireless display mount in parallel along the sidewall of the case. However, without being limited to this example, for instance, the power wires may be arranged in parallel along the rear wall of the case. In this situation, the loop coil built into the wireless display will be arranged to overlap the power wire that is arranged in parallel along the aforementioned rear wall. Therefore, compared to the example in the drawings, the wireless display will protrude out from the wireless display mount by a larger amount.

4. The embodiment illustrates an example of connecting in series a prescribed length (a length such that the power wire protrudes from the end sections in the longitudinal direction of the case for the wireless display mount) of plurality of power wires, which are wired to and housed in the wireless display mount. However, without being limited to this example, for instance, a loop may be formed by housing and wiring one straight electrical cable in order into one housing section (top housing section) for each wireless display mount, and looping back said electrical cable at the end section of the wireless display mount and housing and wiring the cable to the other housing section (the bottom housing section).

REFERENCE NUMERALS

A Wireless display mount
B Terminating member
C Starting member
D Connecting member
E Wireless display
1 Case
2, 2' Power wire (power supply means)
3 Power wire housing section
4 Cavity (space)
5 Locking part (securing means)
7 Connection terminal
9 Loop coil
12 Printed circuit board
13 Electromagnetic wave absorber

The invention claimed is:

1. A wireless display mount which supplies electricity to two or more wireless displays wirelessly via electromagnetic induction, the wireless display mount comprising:
   a band-shaped case;
   a power wire having a prescribed length and arranged in the case along a longitudinal direction of the case, wherein at least a portion of the power wire is split to be spaced apart in a width direction of the case;
   a connection terminal connecting both ends of the power wire with another power wire, wherein the case has a space provided by sidewalls disposed at each end of the case and a rear wall of the case disposed between each of the sidewalls, the two or more wireless displays being installed in the space in the longitudinal direction of the power wire; and
   a securing section disposed at substantially a center of the rear wall and extending in the width direction,
   wherein
      the wireless display mount is mounted on a mounting surface of a metallic body,
      the power wire is disposed at a prescribed distance away from the mounting surface to reduce iron loss from the power wire, and
      one end of the power wire of the wireless display mount is connected to a connection terminal included in a looped terminating member.

2. The wireless display mount according to claim 1 wherein the other power wire is included in the case.

3. The wireless display mount according to claim 2 wherein a wiring configuration for the power wires in the case is such that the power wires are arranged one on top of another in a direction intersecting at right angles with a mounting surface of the case or arranged in parallel along the rear wall of the case.

4. A wireless display mount apparatus comprising:
   a wireless display mount according to claim 1;
      a starting member including a power wire and a connection terminal, wherein the connection terminal of the starting member is connected to one end of the other power wire of the wireless display mount and outputs an alternating current,
      wherein the looped terminating member further includes a power wire, and the power wires in the wireless display mount, the looped terminating member, and the starting member configure a coil with at least one turn by respective connections of the connection terminals.

5. A wireless display system comprising:
   a wireless display mount according to claim 1,
      wherein
      each of the two or more wireless displays has a loop coil inside,
      the wireless display mount has a cavity which houses and secures a housing section,
      the housing section houses the power wire for connecting to a power supply inside the band-shaped case and the each of the two or more wireless displays installed between the power wires, and
      the housing section is disposed at a position that is near the loop coil of each of the two or more the wireless displays when the two or more wireless displays are installed in the cavity of the wireless display mount, and is provided at a position that is spaced from a mounting surface of the wireless display mount.

6. The wireless display mount according to claim 1, wherein each of the wireless displays includes a button configured to display, when pressed, a quantity of a product to be retrieved.

7. A wireless display system comprising:
   a wireless display mount according to claim 4, wherein
   each of the two or more wireless displays has a loop coil inside,
   the wireless display mount has a cavity which houses and secures a housing section,
   the housing section houses the power wire for connecting to a power supply inside the band-shaped case and the each of the two or more wireless displays installed between the power wires, and
   the housing section is disposed at a position that is near the loop coil of each of the two or more the wireless displays when the two or more wireless displays are installed in the cavity of the wireless display mount, and is provided at a position that is spaced from a mounting surface of the wireless display mount.

8. A wireless display mount which supplies electricity wirelessly via electromagnetic induction to two or more wireless displays having a button configured to be operable at a picking operation, the wireless display mount comprising:

a band-shaped case;

a power wire having a prescribed length and arranged in the case along a longitudinal direction of the case, wherein at least a portion of the power wire is split to be spaced apart in a width direction of the case;

a connection terminal connecting both ends of the power wire with another power wire, wherein the case has a space provided by sidewalls disposed at each end of the case and a rear wall of the case disposed between each of the sidewalls, the two or more wireless displays being installed in the space in the longitudinal direction of the power wire; and a securing section disposed at substantially a center of the rear wall and extending in the width direction, wherein the wireless display mount is mounted on a mounting surface of a metallic body, the power wire is disposed at a prescribed distance away from the mounting surface to reduce iron loss from the power wire, and one end of the power wire of the wireless display mount is connected to a connection terminal included in a looped terminating member.

9. The wireless display mount according to claim 8, wherein the other power wire is included in the case.

10. The wireless display mount according to claim 9, wherein a wiring configuration for the power wires in the case is such that the power wires are arranged one on top of another in a direction intersecting at right angles with a mounting surface of the case or arranged in parallel along the rear wall of the case.

11. A wireless display mount apparatus comprising:

a wireless display mount according to claim 8;

a starting member including a power wire and a connection terminal, wherein the connection terminal of the starting member is connected to one end of the other power wire of the wireless display mount and outputs an alternating current, wherein the looped terminating member further includes a power wire, and the power wires in the wireless display mount, the looped terminating member, and the starting member configure a coil with at least one turn by respective connections of the connection terminals.

12. A wireless display system comprising:

a wireless display mount according to claim 8, wherein each of the two or more wireless displays a loop coil inside, the wireless display mount has a cavity which houses and secures a housing section, the housing section houses the power wire for connecting to a power supply inside the band-shaped case and the each of the two or more wireless displays installed between the power wires, and the housing section is disposed at a position that is near the loop coil of each of the two or more the wireless displays when the two or more wireless displays are installed in the cavity of the wireless display mount, and is provided at a position that is spaced from a mounting surface of the wireless display mount.

* * * * *